United States Patent
Huemer et al.

(10) Patent No.: US 10,663,559 B2
(45) Date of Patent: May 26, 2020

(54) RADAR TRANSCEIVER WITH PHASE NOISE CANCELLATION

(71) Applicant: Infineon Technologies AG, Neubiberg (DE)

(72) Inventors: Mario Huemer, Alkoven (AT); Alexander Melzer, Neutillmitsch (AT); Alexander Onic, Linz (AT); Rainer Stuhlberger, Puchenau (DE)

(73) Assignee: Infineon Technologies AG, Neubiberg (DE)

( * ) Notice: Subject to any disclaimer, the term of this patent is extended or adjusted under 35 U.S.C. 154(b) by 315 days.

(21) Appl. No.: 15/726,433

(22) Filed: Oct. 6, 2017

(65) Prior Publication Data
US 2018/0113193 A1   Apr. 26, 2018

(30) Foreign Application Priority Data
Oct. 24, 2016   (DE) .................. 10 2016 120 185

(51) Int. Cl.
*G01S 7/28* (2006.01)
*G01S 13/34* (2006.01)
(Continued)

(52) U.S. Cl.
CPC .......... *G01S 7/2813* (2013.01); *G01S 7/038* (2013.01); *G01S 7/35* (2013.01); *G01S 7/4056* (2013.01);
(Continued)

(58) Field of Classification Search
CPC .......... G01S 7/2813; G01S 7/038; G01S 7/35; G01S 7/4056
See application file for complete search history.

(56) References Cited

U.S. PATENT DOCUMENTS

| 2008/0088503 A1* | 4/2008 | Beasley ............... G01S 7/4056 342/200 |
| 2009/0052556 A1* | 2/2009 | Fernandez ............ H03M 1/662 375/241 |

(Continued)

FOREIGN PATENT DOCUMENTS

DE   102015100804   7/2016

OTHER PUBLICATIONS

Melzer et al., "Short-Range Leakage Cancelation in FMCW Radar Transceivers Using an Artificial On-Chip Target," IEEE Journal of Selected Topics in Signal Processing, vol. 9, No. 8, Dec. 2015, pp. 1650-1660.

*Primary Examiner* — Marc Anthony Armand
(74) *Attorney, Agent, or Firm* — Harrity & Harrity, LLP

(57) ABSTRACT

A method for cancelling phase noise in a radar signal is described herein. In accordance with one embodiment, the method includes transmitting an RF oscillator signal, which represents a local oscillator signal including phase noise, to a radar channel and receiving a respective first RF radar signal from the radar channel. The first RF radar signal included at least one radar echo of the transmitted RF oscillator signal. Further, the method includes applying the RF oscillator signal to an artificial radar target composed of circuitry, which applies a delay and a gain to the RF oscillator signal, to generate a second RF radar signal. The second RF radar signal is modulated by a modulation signal thus generating a frequency-shifted RF radar signal. Further, the method includes subtracting the frequency-shifted RF radar signal from the first RF radar signal.

24 Claims, 4 Drawing Sheets

(51) Int. Cl.
*G01S 7/03* (2006.01)
*G01S 7/35* (2006.01)
*G01S 7/40* (2006.01)
*H03B 1/04* (2006.01)
*G01S 13/931* (2020.01)
*G01S 7/02* (2006.01)

(52) U.S. Cl.
CPC ............ G01S 13/34 (2013.01); G01S 13/343 (2013.01); H03B 1/04 (2013.01); *G01S 13/931* (2013.01); *G01S 2007/028* (2013.01); *G01S 2007/406* (2013.01); *G01S 2007/4065* (2013.01); *H03B 2202/073* (2013.01)

(56) References Cited

U.S. PATENT DOCUMENTS

| | | | |
|---|---|---|---|
| 2010/0265121 A1* | 10/2010 | Bandhauer | G01S 7/2923 342/135 |
| 2017/0199270 A1 | 7/2017 | Huemer et al. | |
| 2018/0011180 A1* | 1/2018 | Warnick | H01Q 3/34 |

* cited by examiner

RADAR TRANSCEIVER WITH PHASE NOISE CANCELLATION

RELATED APPLICATION

This application claims priority under 35 U.S.C. § 119 to German Patent Application No. 102016120185.5, filed on Oct. 24, 2016, the content of which is incorporated by reference herein in its entirety.

TECHNICAL FIELD

The present disclosure generally relates to the field of radar sensor systems and devices, and signal processing employed in such systems and devices. In particular, the present disclosure relates to the estimation and cancellation of phase noise, which may be caused by undesired radar echoes from short-range (SR) targets.

BACKGROUND

Radar systems are well-known in the art, and can generally be divided into pulse radar systems and continuous-wave (CW) systems. A pulse radar system measures a distance to an object (usually referred to as target) by transmitting a short radio-frequency (RF) pulse to an object, and measuring the time taken for the reflected pulse (i.e. the echo) to be received. As the velocity of the pulse is known (i.e. the speed of light), it is straightforward to calculate the distance to an object. However, pulse radar systems are not suitable for use measuring distances of a few 100 meters, in particular because the pulse length must be reduced as the travel time (i.e. distance to the target) decreases. As the pulse length decreases, the energy contained in the pulse decreases, to the point where it becomes impossible to detect the reflected signal. Instead, continuous-wave radar systems are used for measuring comparably short distances. In many applications, such as in automotive applications, so-called frequency-modulated continuous-wave (FMCW) radar systems are used to detect targets in front of the radar device (e.g. an automobile driving ahead) and measure the distances to the detected targets as well as their velocity.

Different from pulsed radar systems, in which isolation between the transmit signal path and the receive signal path is not specifically relevant due to the pulsed operation of the transmitter, a phenomenon referred to as leakage is an issue in FMCW radar systems. Leakage generally describes the problem that a small fraction of the frequency-modulated transmit signal "leaks" into the receive signal path of the radar transceiver without being back-scattered by a target. If the cause of the leakage is in the RF frontend of the radar transceiver (i.e. imperfect isolation of the circulator, which separates receive signal and transmit signal in a monostatic radar configuration) leakage is also referred to as crosstalk between the transmit signal path and the receive signal path. When integrating parts of the radar system (particularly the RF frontend) in one single monolithic microwave integrated circuit (MMIC) crosstalk or so-called on-chip leakage is usually an issue.

Another cause of leakage may be objects, which are very close to the radar antenna (such as, e.g., a fixture or a cover mounted a few centimeters in front of the radar antennas). Such objects are referred as short-range (SR) targets. In an automotive application, the bumper of the automobile, behind which the radar device is installed, may be an SR target. Herein, reflections of the transmitted radar signal at such objects are referred to as short-range leakage (SR leakage), which is a fraction of the transmit signal emanating from the transmit antenna and reflected back (back-scattered) to the receive antenna of the FMCW radar system at one or more SR targets, which are very close to the radar antenna(s).

In radar systems, the overall noise floor limits the sensitivity, with which radar targets can be detected, and thus also limits the accuracy of the distance measurement. Generally, this noise floor is dominated by the additive noise of the transmission channel. However, in case a SR target reflects the transmitted radar signal with comparably high amplitude (i.e. causes short-range leakage) the phase noise (PN) of the transmitted radar signal may dominate the noise floor. The phase noise results in a deteriorated signal detection quality or even makes the detection of radar targets with small radar cross sections impossible.

SUMMARY

A method for cancelling phase noise in a radar signal is described herein. In accordance with one embodiment, the method includes transmitting an RF oscillator signal, which represents a local oscillator signal including phase noise, to a radar channel and receiving a respective first RF radar signal from the radar channel. The first RF radar signal included at least one radar echo of the transmitted RF oscillator signal. Further, the method includes applying the RF oscillator signal to an artificial radar target composed of circuitry, which applies a delay and a gain to the RF oscillator signal, to generate a second RF radar signal. The second RF radar signal is modulated by a modulation signal thus generating a frequency-shifted RF radar signal. Further, the method includes subtracting the frequency-shifted RF radar signal from the first RF radar signal.

Moreover, a radar transceiver is described. According to one embodiment, the radar transceiver includes a local oscillator (LO) operably generating an RF oscillator signal, which includes phase noise. Further, the transceiver includes at least one transmit antenna coupled to the LO for transmitting the RF oscillator signal to a radar channel as well as at least one receive antenna for receiving a first RF radar signal from the radar channel. The first RF radar signal includes at least one radar echo of the transmit-ted RF oscillator signal. The transceiver further includes an artificial radar target that is coupled to the LO to receive the RF oscillator signal, and composed of circuitry, which applies a delay and a gain to the RF oscillator signal, to generate a second RF radar signal. Further, the radar transceiver includes a modulator that is coupled to the artificial radar target to receive the second RF radar signal, and configured to modulate the second RF radar signal with a modulation signal to generate a frequency-shifted RF radar signal. An RF subtractor circuit is coupled to the at least one receive antenna and the modulator, and configured to subtract the frequency-shifted RF radar signal from the first RF radar signal.

BRIEF DESCRIPTION OF THE DRAWINGS

The invention can be better understood with reference to the following drawings and descriptions. The components in the figures are not necessarily to scale; in-stead emphasis is placed upon illustrating the principles of the invention. Moreover, in the figures, like reference numerals designate corresponding parts. In the drawings.

DETAILED DESCRIPTION

As mentioned above, radar echoes caused by the transmitted radar signal, when back-scattered by a short-range target, may introduce phase noise with a comparably high signal power into the receive path of the radar transceiver. This holds true for both, monostatic radar systems (with a common transmit/receive antenna) or bistatic (and pseudo-monostatic) radar-systems (with separate transmit/receive antennas). Some approaches exist for the real-time cancelation of SR leakage. However, not all approaches allow for a full integration of the RF frontend of the radar transceiver in a monolithic integrated microwave circuit (MIMIC).

One approach to cancel SR leakage in the digital intermediate frequency (IF) domain of an integrated radar transceiver makes use of a so-called artificial on-chip target (OCT). An OCT is essentially composed of a delay line integrated in the MIMIC. A significant cross-correlation between the phase noise (PN) in the SR leakage and the OCT output signal exists in the IF domain, even though the time delay of the OCT is significantly smaller than the round-trip delay time (RTDT) of the SR leakage. The RTDT is the time, which the radar signal needs to travel from the transmit antenna to the SR target and back to the receive antenna. As the actual cancellation of the SR leakage is accomplished in the IF domain, the quality of the cancelation is limited by the intrinsic noise floor of the MMIC (e.g. mixer noise, quantization noise from the analog to digital converter (ADC), etc.). In fact, there is a trade-off between the time delay of the OCT and the intrinsic noise floor.

The novel approach described herein, makes use of a signal processing architecture that performs the SR leakage cancelation in the radio frequency (RF) domain using the artificial OCT. Therewith, the requirements with regard to the intrinsic noise floor are relaxed. Before discussing the novel SR leakage cancellation approach in more detail, some general aspects on integrated FMCW radar systems are presented.

Figure 1:
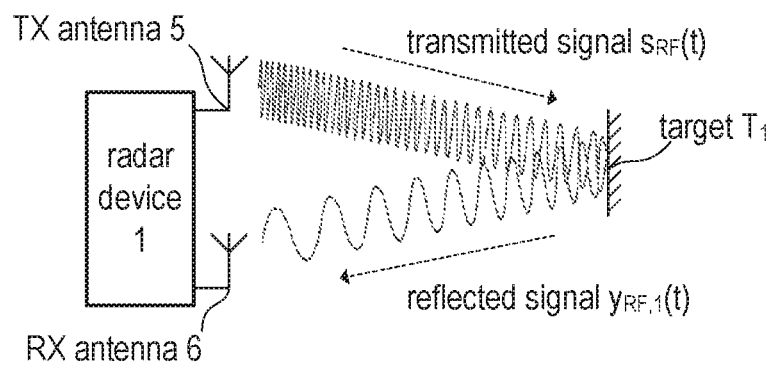
FIG. 1 is a sketch illustrating the operating principle of an FMCW radar system for distance and/or velocity measurement.

FIG. 1 illustrates a frequency-modulated continuous-wave (FMCW) radar system with a radar device 1 (radar transceiver) and a radar target T that is located in the radar channel within the measurement range of the radar device. In the present example, separate transmit (TX) and receive (RX) antennas 5 and 6, respectively, are used. However, it is noted that a single antenna can be used so that the receive antenna and the transmit antenna are physically the same (monostatic radar configuration). The transmit antenna continuously radiates an RF signal $s_{RF}(t)$, which is frequency-modulated, for example, by a saw-tooth signal (periodic linear ramp signal, see also FIG. 2). The transmitted signal $s_{RF}(t)$ is back-scattered at a target T, which is located in the radar channel, and the back-scattered signal $y_{RF}(t)$ is received by the receive antenna 6. The back-scattered signal is denoted as $y_{RF}(t)$.

Figure 2:
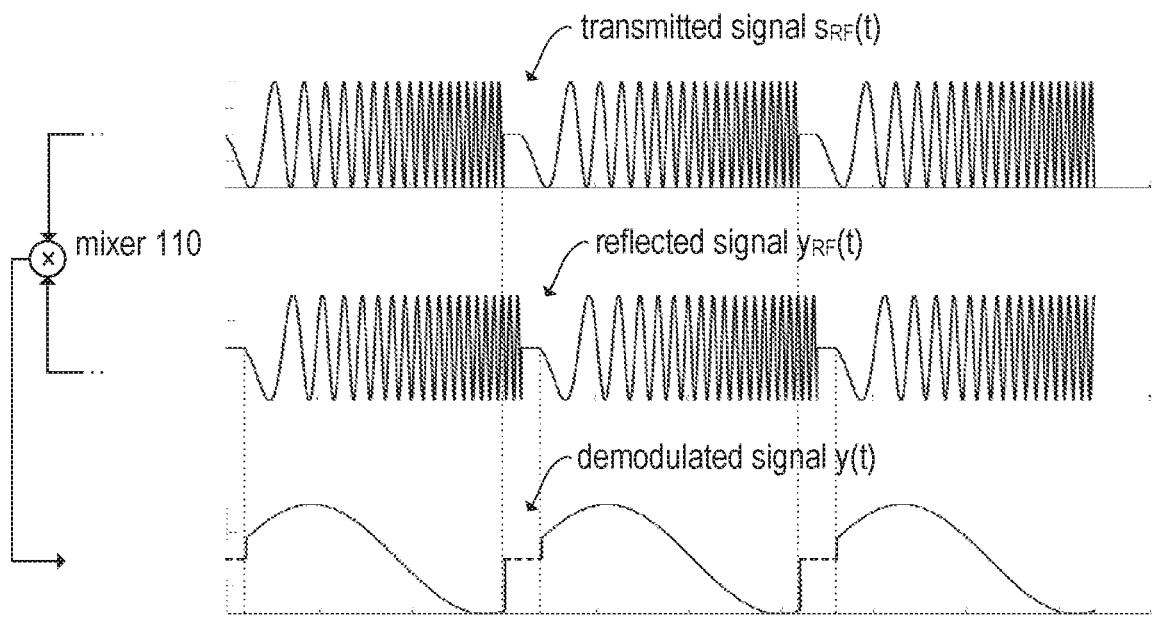
FIG. 2 includes timing diagrams illustrating the frequency modulation and demodulation of the RF signal used in FMCW radar systems.

In the radar transceiver 1, the received signal $y_{RF}(t)$ is demodulated by mixing the signal $y_{RF}(t)$ with a copy of the transmitted RF signal $s_{RF}(t)$ (reference signal) to effect a down-conversion of the RF signal $y_{RF}(t)$ into the base band. This down-conversion is illustrated in FIG. 2. The received RF signal $y_{RF}(t)$ lags behind the transmitted RF signal $s_{RF}(t)$ due to the time (round trip delay time, RTDT), which the radiated signal needs to travel to the target $T_i$ and back to the radar device 1. As a consequence, there is a frequency difference between the received RF signal $y_{RF}(t)$ and the reference signal. When the two signals $s_{RF}(t)$ and $y_{RF}(t)$ are mixed (i.e. demodulated), a demodulated signal y(t) of (almost) constant frequency (in case of a linear frequency modulation) is obtained (also referred to as beat frequency). The beat frequency of the received and demodulated signal y(t) can be determined (e.g. using Fourier analysis) and used to calculate the distance between the radar device 100 and the target $T_i$.

As shown in the first timing diagram of FIG. 2, the signal $s_{RF}(t)$ may be composed of a series of "chirps", i.e. a sinusoidal waveform with increasing (up-chirp) or decreasing (down-chirp). In the present example, the instantaneous frequency f(t) of a chip increases linearly from a start frequency $f_0$ to a stop frequency $f_1$ within a defined time span $T_R$ (chirp duration). Such a chirp is also referred to as a linear frequency ramp. Three identical linear frequency ramps are illustrated in FIG. 2. It is noted, however, that the parameters $f_0$, $f_1$, $T_R$ as well as the pause between the individual frequency ramps may vary dependent on the actual implementation and use of the radar transceiver 1. In practice the frequency variation may be, for example, linear (linear chirp, frequency ramp), exponential (exponential chirp) or hyperbolic (hyperbolic chirp).

Figure 3:
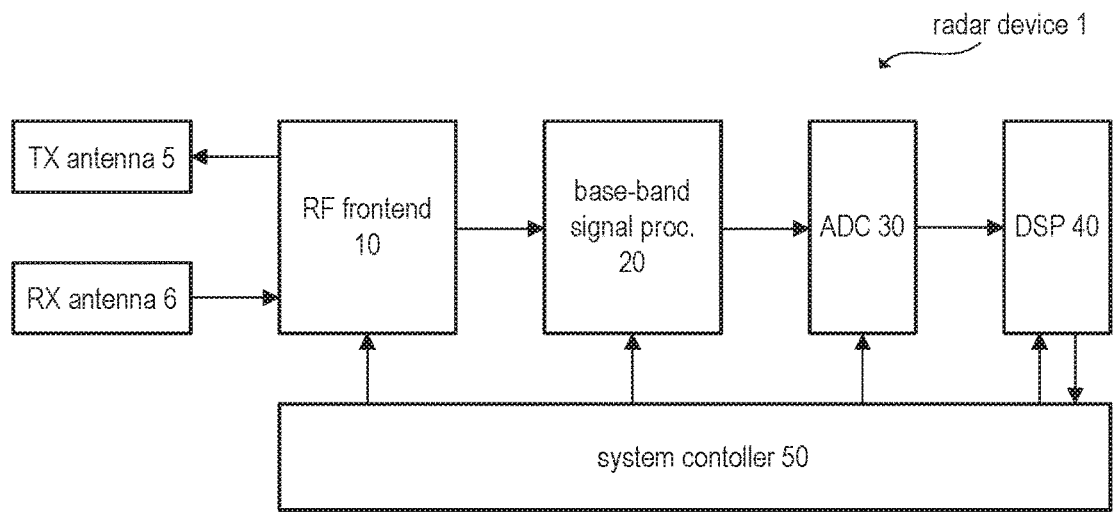
FIG. 3 is a block diagram illustrating the basic structure of an FMCW radar device.

FIG. 3 is a block diagram that illustrates an exemplary structure of a radar transceiver 1 (radar sensor). Accordingly, at least one transmit antenna 5 (TX antenna) and at least one receive antenna 6 (RX antenna) are connected to an RF frontend 10, which may be integrated in a monolithic microwave integrated circuit (MMIC). The RF frontend 10 may include all the circuit components needed for RF signal processing. Such circuit components may include, for example, a local oscillator (LO), RF power amplifiers, low noise amplifiers (LNAs), directional couplers such as rat-race-couplers and circulators, and mixers for the down-conversion of RF signals (e.g. the received signal $y_{RF}(t)$, see FIG. 1) into the base-band or the IF-band. It is noted that antenna-arrays may be used instead of single antennas. The depicted example shows a bistatic (or pseudo-monostatic) radar system, which has separate RX and TX antennas. In case of a monostatic radar system, a single antenna or a single antenna array may be used for both, receiving and transmitting electromagnetic (radar) signals. In this case, a directional coupler (e.g. a circulator or a rat-race coupler) may be used to separate RF signals to be transmitted to the radar channel from RF signals (radar signals) received from the radar channel.

In a frequency-modulated continuous-wave (FMCW) radar system, the transmitted RF signals radiated by the TX antenna 5 are usually in the range between approximately 20

GHz (e.g. 24 GHz) and 81 GHz (e.g. 77 GHz in automotive applications). However, other frequency ranges may be used. As mentioned, the RF signal received by the RX antenna 6 includes the radar echoes, i.e. the signal back-scattered at the so-called radar targets. The received RF signal $y_{RF}(t)$ are down-converted into the base band and further processed in the base-band or IF-band using analog signal processing (see FIG. 3, base-band signal processing chain 20), which basically includes filtering and amplification of the base-band signal. The base-band signal is finally digitized using one or more analog-to-digital converters 30 and further processed in the digital domain (see FIG. 3, digital signal processing chain implemented, e.g., in digital signal processor 40). The overalls system is controlled by a system controller 50, which may be at least partly implemented using a processor such as a microcontroller executing appropriate firmware. The RF frontend 10 and the analog base-band signal processing chain 20 (and optionally the ADC 30) may be integrated in a single MMIC. However, the components may be distributed among two or more integrated circuits.

Figure 4:
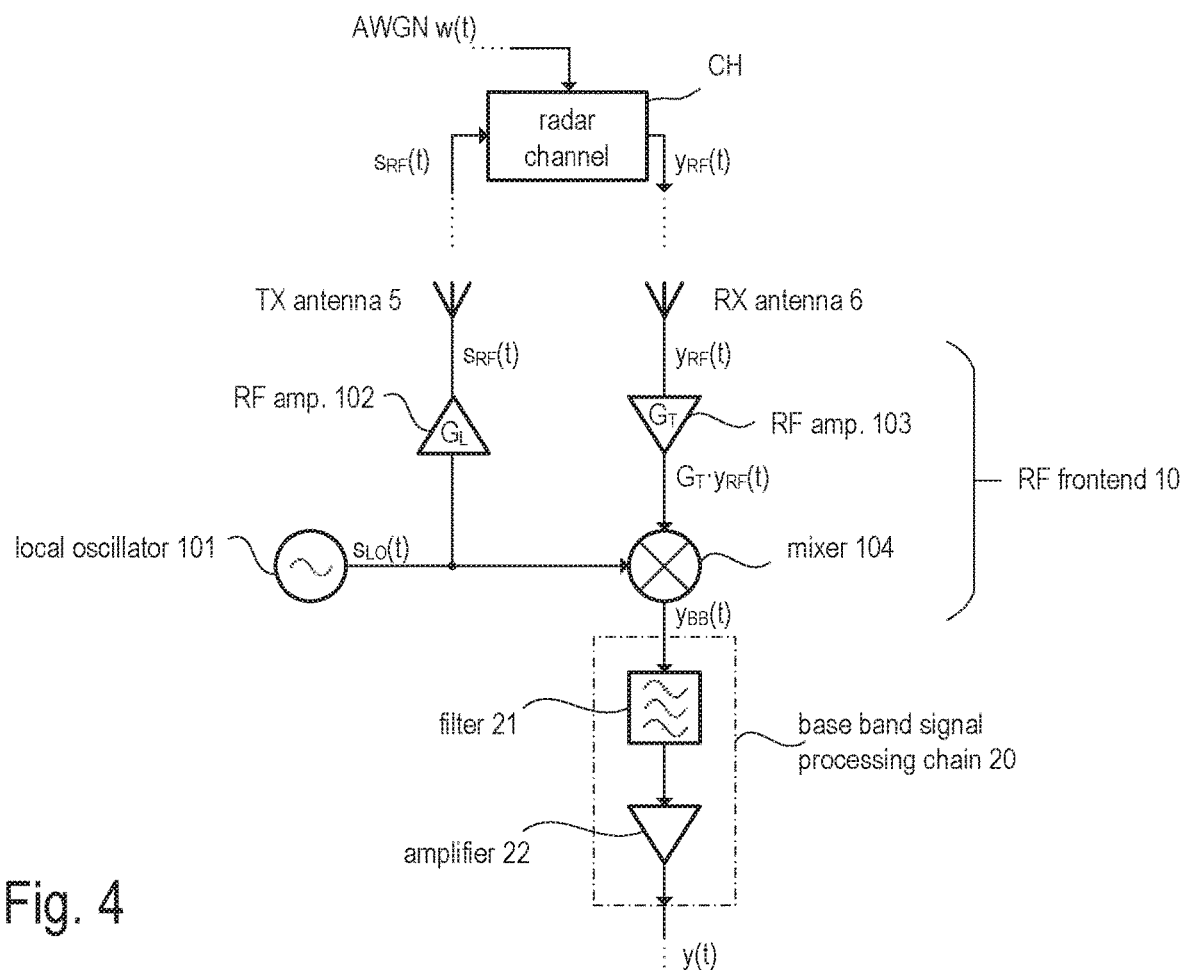
FIG. 4 is a circuit diagram illustrating one example of an analog RF frontend, which may be included in the FMCW radar device of FIG. 3.

FIG. 4 illustrates one exemplary implementation of the RF frontend 10, which may be included in the radar sensor shown in FIG. 3. It is noted that FIG. 4 is a simplified circuit diagram illustrating the basic structure of an RF frontend. Actual implementations, which may heavily depend on the application, are of course more complex. The RF frontend 10 includes a local oscillator 101 (LO) that generates a RF signal $s_{LO}(t)$, which may be frequency-modulated as explained above with reference to FIG. 2. The signal $s_{LO}(t)$ is also referred to as LO signal). In radar applications, the LO signal is usually in the SHF (Super High Frequency) or the EHF (Extremely High Frequency) band, e.g. between 76 GHz and 81 GHz in automotive applications.

The LO signal $s_{LO}(t)$ is processed in the transmit signal path as well as in the receive signal path. The transmit signal $s_{RF}(t)$, which is radiated by the TX antenna 5, is generated by amplifying the LO signal $s_{LO}(t)$, e.g., using an RF power amplifier 102. The output of the amplifier 102 is coupled to the TX antenna 5. The transmission channel (i.e. the electromagnetic transmission path), in which the radar targets are located and in which the radar signal is superimposed with noise w(t) (e.g. arbitrary white Gaussian noise, AWGN), is also illustrated in FIG. 4 as a separate block labelled CH. The received signal $y_{RF}(t)$, which is received by the RX antenna 6, is provided to a mixer 104 for the mentioned down-conversion into the base-band or IF-band.

In the present example, the received signal $y_{RF}(t)$ (i.e. the antenna signal) is pre-amplified by RF amplifier 103 (gain $G_L$), so that the mixer receives the amplified signal $G_L \cdot y_{RF}(t)$ at its RF input. The mixer 104 further receives the LO signal $s_{LO}(t)$ at its reference input and is configured to down-convert the amplified signal $G_L \cdot y_{RF}(t)$ into the base band. The resulting base-band signal at the mixer output is denoted as $y_{BB}(t)$. The base-band signal $y_{BB}(t)$ is further processed by the analog base band signal processing chain 20 (see also FIG. 3), which basically includes one or more filters (e.g. a band-pass 21) to remove undesired side bands and image frequencies as well as one or more amplifiers such as amplifier 22). The analog output signal, which may be supplied to an analog-to-digital converter (cf. FIG. 3) is denoted as y(t).

In the present example, the mixer 104 down-converts the RF signal $G_L \cdot y_{RF}(t)$ (amplified antenna signal) into the base band. The respective base band signal (mixer output signal) is denoted by $y_{BB}(t)$. The down-conversion may be accomplished in a single stage (i.e. from the RF band into the base band) or via one or more intermediate stages (from the RF band into an IF band and subsequently into the base band). The base-band or IF-band signal y(t) is digitized (see FIG. 3, ADC 30) and further processed in the digital domain (see FIG. 3, DSP 40).

Figure 5:
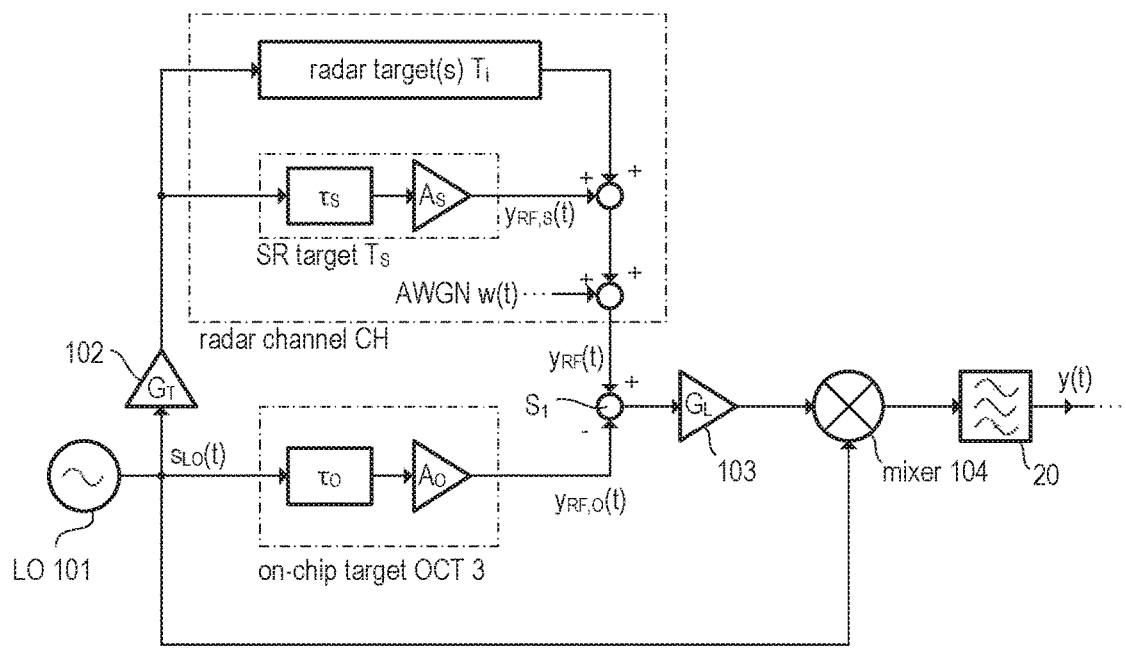
FIG. 5 is a block diagram illustrating a system model of a radar transceiver with an on-chip target (OCT) for SR leakage cancellation.

FIG. 5 is a block diagram illustrating a system model of a radar transceiver with an on-chip target (OCT), which can be used for a simple cancellation of SR leakage. It is understood, that the system model of FIG. 5 merely illustrates the signal flow in the system and is simplified, so that a mathematical model can be derived therefrom. However, the model is adequate to represent a real implementation with sufficient accuracy. Apart from the OCT, the system illustrated in FIG. 5 is essentially the same as in the previous example of FIG. 4. Moreover, the system model of FIG. 5 illustrates the radar channel in more detail.

According to the system model of FIG. 5, a local oscillator (LO) 101 generates an RF local oscillator signal (LO signal) $s_{LO}(t)$. The LO 101 may include a phase-locked loop (PLL), which can be tuned to generate a sequence of chirps as shown, for example, in FIG. 2. The LO signal $s_{LO}(t)$ is amplified by amplifier 102 with a gain $G_T$ and transmitted (via an antenna not shown in FIG. 5) to the radar channel CH. Further, the LO signal $s_{LO}(t)$ is supplied to the input of the OCT 3 as well as to the reference input of the mixer 104.

In the present example, the radar channel CH includes one short-range (SR) target $T_S$ (which is closer to the radar transceiver as a lower limit of the specified measurement range) as well as one or more normal radar targets which are located in a distance from the radar transceiver within the specified measurement range. The SR target $T_S$ is modelled as a series circuit of a delay element, which provides a delay time $\tau_S$, and an attenuator with a gain $A_S$, wherein $A_S<1$. Accordingly, the SR leakage $y_{RF,S}(t)$ may be expressed as:

$$y_{RF,S}(t)=G_T \cdot A_S \cdot s_{LO}(t-\tau_S). \qquad (1)$$

The normal radar targets $T_i$ may also be modelled using a delay and a gain. While the radar signals pass through the radar channel CH, noise is superimposed on the transmitted radar signal $G_T \cdot s_{LO}(t)$ as well as on the back-scattered radar signal. In the system model of FIG. 5 additive white Gaussian noise (AWGN) w(t) is added to the sum of the outputs of the radar target(s) and the SR target $T_S$. Thus, the output signal $y_{RF}(t)$ of the radar channel is the sum of the radar echoes $y_{RF,Ti}(t)$ back-scattered at the normal radar targets $T_i$, the SR leakage $y_{RF,S}(t)$, and AWGN w(t). That is, $$y_{RF}(t)=y_{RF,S}(t)+w(t)+\Sigma_{i=1}^{N} y_{RF,T_i}(t), \qquad (2)$$

wherein $y_{RF,Ti}(t)$ is the radar echo back-scattered at target $T_i$ (i=1, . . . , N).

As mentioned, the OCT 3 is composed of a series circuit of a delay element, which provides a delay time $\tau_O$, and a gain $A_O$. The local oscillator signal $s_{LO}(t)$ is supplied to the input of OCT 3, and thus the output signal $y_{RF,O}(t)$ of the OCT 3 can be expressed as:

$$y_{RF,O}(t)=A_O \cdot s_{LO}(t-\tau_O). \qquad (3)$$

According to the system model of FIG. 5, the output signal $y_{RF,O}(t)$ of the OCT is subtracted from the received radar signal $y_{RF}(t)$ (output of the radar channel CH) at the subtraction node $S_1$. The resulting difference signal is amplified by amplifier 103 (gain $G_L$) and provided to the RF input of mixer 104. Accordingly, the signal at the RF input of the mixer is $$y_{RF}(t)-y_{RF,O}(t)=y_{RF,S}(t)-y_{RF,O}(t)w(t)+\Sigma_{i=1}^{N} y_{RF,T_i}(t). \qquad (4)$$

One can see from equation 4, that the SR leakage $y_{RF,S}(t)$ can be completely cancelled if the output signal $y_{RF,O}(t)$ of OCT 3 is equal to the SR leakage $y_{RF,S}(t)$. This is the case when the delay time (RTDT) $\tau_S$ of the SR target $T_S$ is equal to the delay $\tau_O$ of OCT 3 ($\tau_S=\tau_O$) and if the gain $A_O$ of OCT 3 equals $G_T A_S$ (see equations 2 and 3). However, the condition $\tau_S=\tau_O$ is hard to comply with when the radar transceiver (or at least the RF frontend) is to be integrated in a single MMIC. In realistic examples the RTDT is of the short-range target $T_S$ is in the range of a few hundreds of picoseconds up to a few nanoseconds, whereas the delay $\tau_O$ of an OCT is practically limited to a few picoseconds when implementing the radar transceiver on a single MMIC. In a single-chip radar higher values of delay $\tau_O$ (which would be needed to ensure that $\tau_S=\tau_O$) would result in an undesired (or even unrealistic) increase in chip area. Further, the insertion loss of a delay line, which implements a delay $\tau_S=\tau_O$ in silicon, would be severe. Thus the concept in FIG. 5 can be realized (in an economically feasible way) when using discrete circuit components (at least for the OCT).

In view of the above explanations, it is noted that, for a realistic implementation of an OCT in an MMIC, the condition $\tau_O \ll \tau_S$ should be observed. In fact, with an OCT having a short delay $\tau_O$ (shorter than the RTDT $\tau_S$ of the SR target $T_S$) a cancellation of the SR leakage is not possible with the system illustrated in FIG. 5. However, before discussing any modifications of the system of FIG. 5, the impact of the delay $\tau_O$ on the OCT output signal is explained in more detail below. As mentioned above with reference to FIG. 2, the LO signal $s_{LO}(t)$, which is supplied to the input of the OCT, is a sequence of linear chirps. In case of an up-chirp the LO signal $s_{LO}(t)$ is, $$s_{LO}(t)=A_{LO}\cdot\cos(2\pi f_0 t+\pi k t^2+\Phi_{LO}+\varphi(t)), \quad (5)$$

wherein $A_{LO}$, $f_0$, k, and $\Phi_{LO}$ denote the amplitude, the start frequency of the chip, the frequency slope of the chirp and the initial phase, respectively. Further, $\varphi(t)$ denotes the phase noise (PN) of the local oscillator. Equation 5 is evaluated for $t \in [0, T_R]$, wherein $T_R$ denotes the duration of one chirp.

As the down-conversion by mixer 104 is a linear operation, the mixer output signal y(t)—after suppression of noise and undesired side-bands and image frequencies by filter 20—may be expressed as (cf. equation 4)

$$y(t)=y_S(t)-y_O(t)+\Sigma_{i=1}^N y_{T_i}(t), \quad (6)$$

wherein $y_S(t)$, $y_O(t)$, and $y_{T_i}(t)$ are the contributions due to the SR target, the OCT and the normal radar targets, respectively. It is noted that the complete suppression of AWGN w(t) is a simplification which is, however, sufficient for the present discussion. With the transmit signal according to equation 5, the contribution of the OCT can be calculated as:

$$y_O(t) = \frac{A_{LO}^2 A_O G_L}{2} \cdot \cos(2\pi f_{BO} t + \Phi_O + \Delta\varphi_O(t)) \quad (7)$$

wherein $f_{BO}$ denotes the beat frequency resulting from the OCT, $\Phi_O$ denotes a constant phase, and $\Delta\varphi_O(t)$ denotes the so-called decorrelated phase noise (DPN), and wherein $$f_{BO}=k\tau_O,$$

$$\Phi_O=2\pi f_0\tau_O-k\pi\tau_O^2, \text{ and}$$

$$\Delta\varphi_O(t)=\varphi(t)-\varphi(t-\tau_O). \quad (8)$$

One can see from equations 7 and 8 that the resulting beat frequency $f_{BO}$ is directly proportional to the delay $\tau_O$ of the OCT.

The contribution of the SR leakage $y_{RF,S}(t)$ to the filtered mixer output signal y(t) can be calculated in the same way as equations 7 and 8. Accordingly, $$y_S(t) = \frac{A_{LO}^2 G_T A_S G_L}{2} \cdot \cos(2\pi f_{BS} t + \Phi_S + \Delta\varphi_S(t)) \quad (9)$$

wherein $f_{BS}$ denotes the beat frequency resulting from the SR target, $\Phi_S$ denotes a constant phase, and $\Delta\varphi_S(t)$ denotes the respective DPN, and wherein $$f_{BS}=k\tau_S,$$

$$\Phi_S=2\pi f_0\tau_S-k\pi\tau_S^2, \text{ and}$$

$$\Delta\varphi_S(t)=\varphi(t)-\varphi(t-\tau_S). \quad (10)$$

It is noted that equations 7 to 10 are based on the assumption that AWGN w(t) is absent and the analog base-band processing chain 20 (essentially including a filter) does not distort the signal in the pass band. Furthermore, one can see from equations 8 and 10 that the beat frequencies $f_{BO}$ and $f_{BS}$ due to the OCT and the SR target, respectively, are linked:

$$f_{BO} = \frac{\tau_O}{\tau_S} f_{BS}. \quad (11)$$

Accordingly, if $\tau_O \ll \tau_S$, then the beat frequency $f_{BO}$ due to the OCT is smaller by a factor of $\tau_O/\tau_S$ than the beat frequency $f_{BS}$ due to the SR target ($\tau_O/\tau_S < 1$). At this point it should be noted that the delay $\tau_O$ of the OCT and the RTDT $\tau_S$ of the SR target are system parameters, which are either known or can be measured for a specific radar transceiver.

Furthermore, it is noted that, in equation 9, the DPN $\Delta\varphi_S(t)$ may be extracted from the $\cos(\bullet)$ term and written as a separate phase noise term when using the approximations $\sin(\Delta\varphi_S(t)) \approx \Delta\varphi_S(t)$ and $\cos(\Delta\varphi_S(t)) \approx 1$. This phase noise term would also be subject to filtering by the analog base-band processing chain 20. However, this effect is not important for the present discussion and thus neglected here. That is, it is assumed that the analog base-band processing chain 20 does not affect the filtered signals in the pass-band. In practice the low-pass filtering in the analog base-band processing chain 20 is considered by a modified DPN scaling factor (see equation 18 below).

Figure 6:
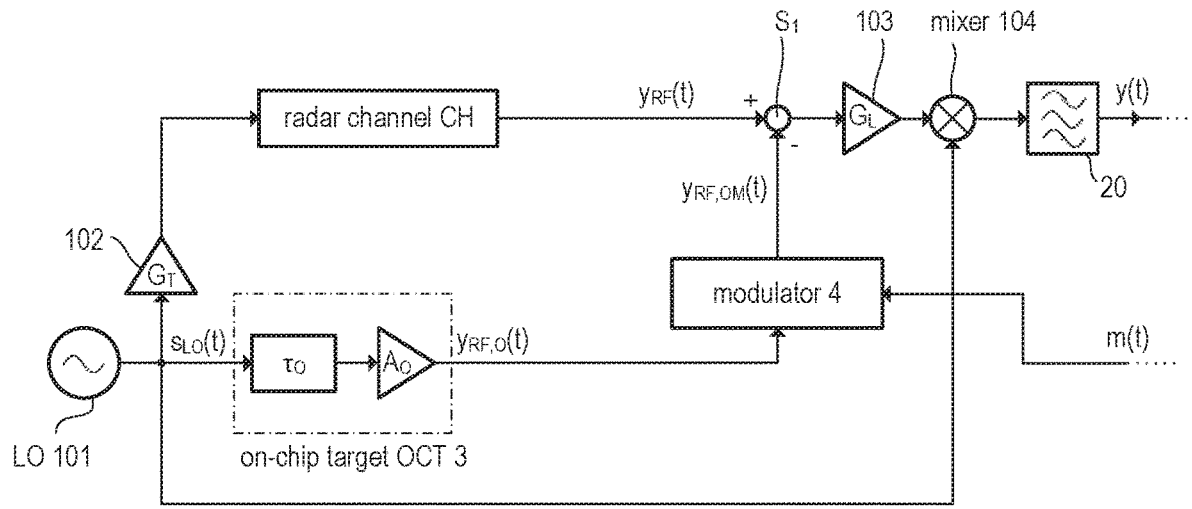
FIG. 6 is a block diagram illustrating a system model of a radar transceiver with an on-chip target (OCT) for SR leakage cancellation according to one exemplary embodiment.

To compensate for the frequency offset between $f_{BO}$ and $f_{BS}$ (see equation 11), the novel SR leakage cancelation approach described herein utilizes an I/Q modulator in the RF domain. For that purpose, the system model of FIG. 5 may be modified and enhanced as illustrated in FIG. 6. As compared with the previous example of FIG. 5, the enhancement basically includes a modulator 4 connected between the OCT 3 and subtraction node $S_1$. Accordingly, the modulator 4 is supplied with the OCT output signal $y_{RF,O}(t)$ and generates a modulated OCT output signal $y_{RF,OM}(t)$. The modulator 4 is configured to modulate the OCT output signal $y_{RF,O}(t)$ with a modulation signal m(t), wherein $$m(t)=A_M\cos(2\pi f_M t+\Phi_M), \text{ and} \quad (12)$$

$$y_{RF,OM}(t)=y_{RF,O}(t)\cdot m(t)=y_{RF,O}(t)\cdot A_M\cos(2\pi f_M t+\Phi_M). \quad (13)$$

The generation of the modulation signal m(t) is explained later and can be regarded as system input for the moment.

Apart from the additional modulator 4, the system shown in FIG. 6 is essentially the same as the previous example of FIG. 5 and reference is made to the respective description to avoid redundant explanations.

To elaborate the function and the effect of the additional modulator 4, the down-converted and filtered mixer output signal y(t) is considered. As the down-conversion by mixer 104 is a linear operation, the mixer output signal y(t)—after suppression of noise and undesired side-bands and image frequencies by filter 20—may be expressed as (cf. equation 6)

$$y(t)=y_S(t)-y_{OM}(t)+\Sigma_{i=1}^N y_{T_i}(t), \qquad (14)$$

wherein $y_S(t)$, $y_{OM}(t)$, and $y_{T_i}(t)$ are the contributions due to the SR leakage, the modulated OCT output and the echoes from the normal radar targets $T_i$, respectively. The signal component $y_S(t)$ is defined in equations 9 and 10. The signal component $y_{OM}(t)$ can be calculated by combining equations 3, 5, and 13 and subsequent down-conversion into the base-band. The result can be obtained by a similar calculation as equations 7 and 8, and thus $y_{OM}(t)$ is $$y_{OM}(t) = \frac{A_{LO}^2 A_O A_M G_L}{2} \cdot \cos(2\pi f_{BOM} t + \Phi_{OM} + \Delta\varphi_O(t)), \qquad (15)$$

wherein $f_{BOM} = k\tau_O + f_M = f_{BO} + f_M,$ $\Phi_{OM} = 2\pi f_O \tau_O - k\pi\tau_O^2 + \Phi_M = \Phi_O + \Phi_M,$ and $$\Delta\varphi_O(t) = \varphi(t) - \varphi(t-\tau_O). \qquad (16)$$

With the above result, the parameters $A_M$, $f_M$, and $\Phi_M$ can be determined so that a cancellation of the SR leakage is achieved in the RF domain (note, the subtraction node $S_1$ is upstream to the mixer 104). When comparing equations 15 and 16 with equations 9 and 10, one can see that cancellation of the SR leakage can be achieved when $$A_M = \frac{G_T A_S}{A_O}, \qquad (17)$$

$f_M = f_{BS} - f_{BO} = k\tau_S - k\tau_O = k \cdot (\tau_S - \tau_O),$ and $\Phi_M = \Phi_S - \Phi_O.$ Although a cancellation of the SR leakage may be achieved when choosing the Parameters $A_M$, $f_M$, and $\Phi_M$ according to equation 17, the corresponding DPN is not completely eliminated, because the DPN included in the SR leakage is not equal to the DPN included in the OCT output. That is, $\Delta\varphi_O(t) \neq \Delta\varphi_S(t),$ and $$\Delta\varphi_S(t) - \Delta\varphi_O(t) = \varphi(t-\tau_O) - \varphi(t-\tau_S). \qquad (18)$$

However, at this point it should be noted that cancellation of the resulting beat frequency from the SR leakage is not the primary goal but rather the cancellation of the DPN introduced by the SR leakage into the receive path of the radar transceiver. As mentioned, DPN introduced by SR leakage may cause an increase of the overall noise floor in the radar transceiver and thus cancellation of the DPN may significantly improve the performance of the radar measurements.

It can be shown (see, e.g., A. Melzer, A. Onic, F. Starzer, and M. Huemer, "*Short-Range Leakage Cancelation in FMCW Radar Transceivers Using an Artificial On-Chip Target*", in IEEE Journal of Selected Topics in Signal Processing, Vol. 9, No. 8, pp. 1650-1660, December 2015) that the terms $\varphi(t-\tau_O)$ and $\varphi(t-\tau_S)$ are highly correlated even if the OCT delay $\tau_O$ is significantly smaller than the RTDT associated with the SR target. Therefore, the DPN included in the SR leakage can be approximated as $$\Delta\varphi_S(t) \approx \alpha_L \cdot \Delta\varphi_O(t), \qquad (19)$$

wherein $\alpha_L$ is referred to as DPN scaling factor, which may essentially be computed based on the delay values $\tau_O$ and $\tau_S$ and the power spectrum density of the phase noise $\varphi(t)$, which can be determined by known measurement techniques. The DPN scaling factor $\alpha_L$ is a measure of how much the DPN included in the OCT output needs to be amplified such that it approximates the DPN included in the SR leakage. For example, with a typical phase noise power spectrum, $\tau_S$=800 ps and $\tau_O$=80 ps results in a DPN gain of $\alpha_L$=9.987.

As compared to the SR leakage itself, the DPN terms $\Delta\varphi_O(t)$ and $\Delta\varphi_S(t)$ are sufficiently small to allow for a further approximation (e.g., $\cos(\Delta\varphi_O(t)) \approx 1$ and $\sin(\Delta\varphi_O(t)) \approx \Delta\varphi_O(t)$), by which the DPN can be "transformed" into amplitude noise. Applying the mentioned approximation on equations 9 and 14, it can be shown that cancellation of the DPN included in the SR leakage can be achieved when the amplitude value $A_M$ of the modulation signal m(t) is adjusted to $$A_M = \frac{G_T A_S}{A_O} \alpha_L. \qquad (20)$$

It is noted that, with this adjustment of the amplitude $A_M$, the beat frequency $f_{BS}$ of the SR leakage (see equations 9 and 10) is not perfectly cancelled (as it could be when choosing $A_M$ according to equation 17). However, using a modulation signal m(t) with an adjusted amplitude according to equation 20 enables a better cancellation of the DPN $\Delta\varphi_S(t)$, which is included in the SR leakage. DPN cancellation may be regarded as more important than the complete cancellation of the beat frequency, since the DPN is responsible for a degradation of the sensitivity of the radar sensor. The only drawback is the remaining peak at the beat frequency $f_{BS}$ (in the spectrum of the mixer output signal) after cancelation, which, however, does not negatively affect distance and velocity measurement. Nevertheless, as the signal component oscillating at the beat frequency $f_{BS}$ may have a relatively high amplitude suppression of this signal component may still be desired in order to optimize analog-to-digital conversion (see FIG. 7, ADC 30) with regard to a low quantization noise. The beat frequency may be therefore easily suppressed with a high pass filter included in the base-band signal processing chain 20. Accordingly, the high-pass filter included in the base-band signal processing chain 20 has a lower cut-off frequency that is above the beat-frequency $f_{BS}$. Instead of a low-pass and a high-pass filter, the base-band signal processing chain 20 may also include an analog band-pass filter.

Figure 7:
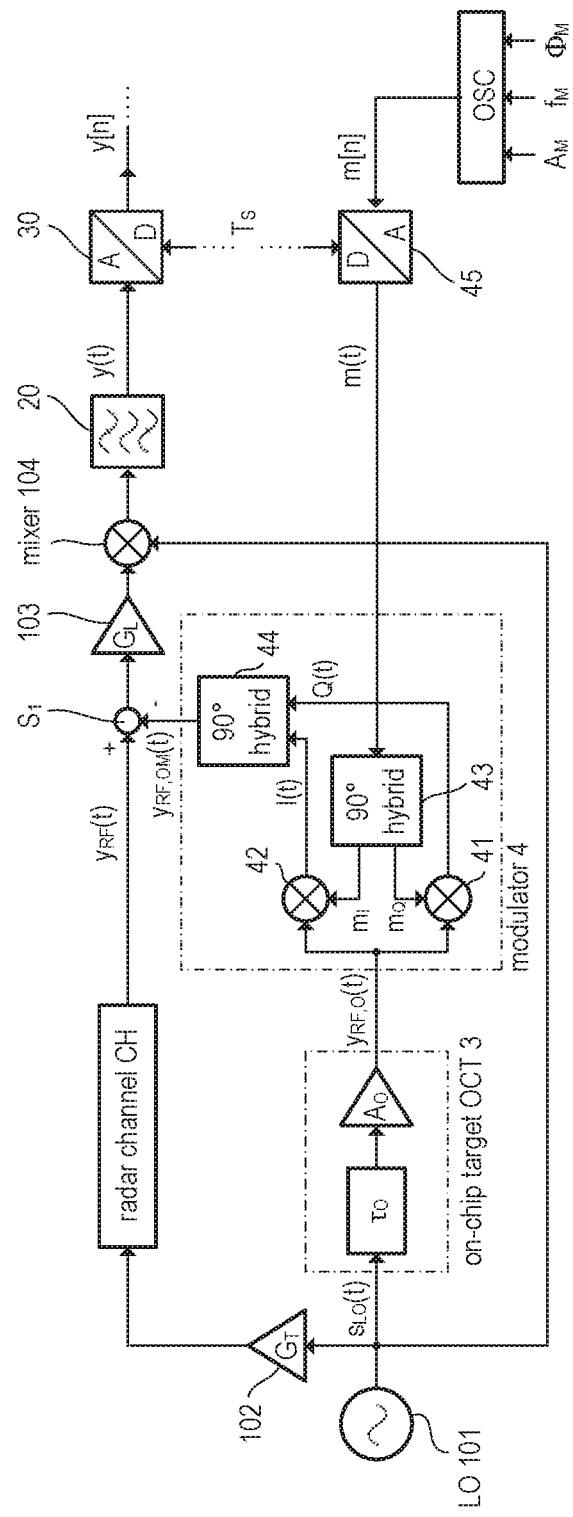
FIG. 7 is a block diagram illustrating exemplary implementation of the embodiment of FIG. 6 in more detail.

FIG. 7 illustrates one exemplary implementation of the more general embodiment of FIG. 6. The embodiment of FIG. 7 is essentially the same as the previous example of FIG. 6, except that one exemplary implementation of the modulator 4 is included in FIG. 7 as well as further circuit components used for generating the modulation signal m(t) and for digitizing the filtered mixer output signal y(t). Accordingly, the modulator 4 includes a first 90° hybrid coupler that receives the modulator signal m(t) and "splits" the modulator signal in an in-phase signal $m_I(t)$ and a quadrature signal $m_Q(t)$. The signal $m_I(t)$ is in-phase with the incoming modulator signal m(t) and signal $m_Q(t)$ lags behind the incoming modulator signal m(t) by a phase shift of 90°. The amplitudes of the signals $m_I(t)$ and $m_Q(t)$ may be attenuated (as compared to the incoming modulator signal m(t)) by approximately 3 dB when using, e.g. a branch-line coupler.

The modulator further includes a first mixer 41 and a second mixer 42, both receiving the OCT output signal at their signal inputs. The first mixer 41 receives the signal $m_Q(t)$ at its reference input, and the second mixer 42 receives the signal $m_I(t)$ at its reference input. Therefore, the first mixer 41 generates a quadrature signal Q(t) as output signal, and the second mixer 42 generates an in-phase signal I(t) as output signal. Both output signal I(t) and Q(t) are supplied to a second 90° hybrid coupler 44, which is configured to combine both signals to generate the modulator output signal $y_{RF,OM}(t)$. The modulator 4 used in the present example is as such known as I/Q modulator and therefore not discussed in more detail herein. In essence, the I/Q modulator "shifts" the beat frequency $f_{BO}$ resulting from the OCT output by the frequency value $f_M$. Accordingly, the frequency-shifted beat frequency $f_{BOM}$ resulting from the modulated OCT output is $f_{BO}+f_M$, which equals $f_{BS}$ if $f_M=f_{BS}-f_{BO}$ as given by equation 16.

The modulation signal m(t) may be generated in the digital domain as digital signal m[n] (n being a discrete time index) and converted to an analog signal by a digital-to-analog converter (DAC) 45. The digital signal m[n] may be synthesized using any known technique (e.g. direct digital synthesis, DDS) for digitally generating sinusoidal signals. In the present example, the digital signal m[n] is generated by a digital oscillator OSC, which receives amplitude $A_M$, frequency $f_M$ and phase $\Phi_M$ as input parameters. The digital oscillator OSC may be implemented using dedicated hardware integrated in the MMIC or, alternatively, may also be implemented using software instructions executed by a digital signal processor, e.g. DSP 40 (see FIG. 3).

Also shown in FIG. 7 is an analog-to-digital converter (ADC) 30 (see also FIG. 3), which is configured to digitize (sample and quantize) the filtered mixer output signal y(t) to generate a respective digital radar signal y[n]. ADC 30 and DAC 45 may be clocked by the same clock signal having a clock period $T_S$, which determines the sampling period. The digital radar signal y[n] may be further processed using a digital signal processor (see FIG. 3, DSP 40) programmed to execute appropriate software. As mentioned above, the software usually represents algorithms for Range-Doppler Processing to calculate so-called Range-Doppler maps, which may be used to detect the radar targets $T_i$ located in the radar channel at a distance included in the specified measurement range of the radar device.

With the method and system described herein with reference to FIGS. 6 and 7, a good cancellation of phase noise may be achieved, which is introduced into the receive path of the radar transceiver by SR leakage. The cancellation is accomplished solely in the RF domain, i.e. before the received radar signal (see, e.g. signal $y_{RF}(t)$ in FIG. 6) is down-converted into the base band/IF-band. The cancellation in the RF band is not affected by intrinsic noise of the mixer and the ADC (see, e.g., FIG. 7, mixer 104, ADC 30), and thus the respective requirements with regard to the intrinsic noise may be relaxed.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for cancelling phase noise in a radar signal, the method comprising:
transmitting a radio frequency (RF) oscillator signal to a radar channel,
the RF oscillator signal representing a local oscillator signal including phase noise;
receiving a first RF radar signal from the radar channel,
the first RF radar signal including at least one radar echo of the RF oscillator signal and a short-range (SR) leakage signal caused by a SR target, and
the SR target being associated with a round-trip delay time (RTDT) that is greater than a delay associated with an artificial radar target;
applying the RF oscillator signal to the artificial radar target to generate a second RF radar signal,
the artificial radar target being composed of circuitry that applies a delay and a gain to the RF oscillator signal;
modulating the second RF radar signal by a modulation signal to generate a frequency-shifted RF radar signal; and
subtracting the frequency-shifted RF radar signal from the first RF radar signal.

2. The method according to claim 1, wherein the phase noise included in the RF oscillator signal, is present in the first RF radar signal and the second RF radar signal.

3. The method according to claim 1, wherein the phase noise, included in the RF oscillator signal, is introduced into the first RF radar signal by the at least one radar echo.

4. The method according to claim 3, wherein the phase noise introduced into the first RF radar signal by the at least one radar echo is approximated by a phase noise included in the second RF radar signal amplified by a noise gain.

5. The method according to claim 4, wherein the modulation signal has an amplitude which is set dependent on the noise gain.

6. The method according to claim 4, wherein the noise gain is set based on the delay associated with the artificial radar target, the RTDT, and a power spectrum density of the phase noise included in the RF oscillator signal.

7. The method according to claim 1, wherein the modulation signal has a modulation frequency that depends on the RTDT and the delay associated with the artificial radar target.

8. The method according to claim 1, wherein the modulation signal has a modulation frequency that is proportional to a difference between the RTDT and the delay associated with the artificial radar target.

9. The method according to claim 1, further comprising:
down-converting a third RF radar signal that results from subtracting the frequency-shifted RF radar signal from the first RF radar signal into a base-band to generate a base-band radar signal which includes at least one beat frequency corresponding to the at least one radar echo.

10. The method according to claim 9, further comprising:
high-pass filtering the base-band radar signal to remove at least one of the at least one beat frequency caused by the SR target from the base-band radar signal, and/or
low-pass filtering the base-band radar signal to remove undesired image frequencies caused by the down-conversion.

11. The method according to claim 10, wherein the high-pass filtering is accomplished before or after the low-pass filtering, or
wherein the high-pass filtering and the low-pass filtering are accomplished by a band-pass filter.

12. A radar transceiver, comprising:
a local oscillator (LO) operably generating a radio frequency (RF) oscillator signal that includes phase noise;
at least one transmit antenna coupled to the LO, for transmitting the RF oscillator signal to a radar channel;
at least one receive antenna for receiving a first RF radar signal from the radar channel,
the first RF radar signal including at least one radar echo of the RF oscillator signal and a short-range (SR) leakage signal caused by a SR target, and
the SR target being associated with a round-trip delay time (RTDT) that is greater than a delay associated with an artificial radar target;
the artificial radar target coupled to the LO and configured to receive the RF oscillator signal, and composed of circuitry, which applies a delay and a gain to the RF oscillator signal, to generate a second RF radar signal;
a modulator, coupled to the artificial radar target, to:
receive the second RF radar signal, and
modulate the second RF radar signal with a modulation signal to generate a frequency-shifted RF radar signal; and
an RF subtractor circuit coupled to the at least one receive antenna and the modulator, and configured to subtract the frequency-shifted RF radar signal from the first RF radar signal.

13. The radar transceiver according to claim 12, wherein the at least one transmit antenna and the at least one receive antenna are identical in a monostatic radar configuration.

14. The radar transceiver according to claim 12, further comprising:

an RF amplifier, coupled between the LO and the at least one transmit antenna, for amplifying the RF oscillator signal.

15. The radar transceiver according to claim 14, wherein the RF amplifier is a first RF amplifier, and
wherein the radar transceiver further comprises:
a second RF amplifier, coupled to the at least one receive antenna, for amplifying the first RF radar signal.

16. The radar transceiver according to claim 15, wherein the second RF amplifier is coupled to the at least one receive antenna downstream of the RF subtractor circuit.

17. The radar transceiver according to claim 12, wherein the modulator is an I/Q-modulator that includes:
a first mixer to generate an in-phase signal,
a second mixer to generate a quadrature signal, and
a hybrid coupler configured to combine the in-phase signal and the quadrature signal to generate the frequency-shifted RF radar signal.

18. The radar transceiver according to claim 17, wherein the I/Q-modulator includes another hybrid coupler configured to direct the modulation signal to the first mixer and the second mixer.

19. The radar transceiver according to claim 12, further comprising:
an oscillator configured to generate the modulation signal for the modulator with a frequency that depends on the delay associated with the artificial radar target and the RTDT.

20. The radar transceiver according to claim 12, further comprising:
a mixer coupled to the RF subtractor circuit and configured to down-convert, into a base-band, an output signal of the RF subtractor circuit representing a difference between the first RF radar signal and the frequency-shifted RF radar signal.

21. The radar transceiver according to claim 20, further comprising:
a base band signal processing chain coupled to the mixer downstream and including at least one of:
a high-pass filter, or
a low-pass filter.

22. The radar transceiver according to claim 12, wherein the LO, the modulator, and the artificial radar target are integrated in a single monolithic microwave integrated circuit (MMIC).

23. The method according to claim 1, further comprising:
amplifying the RF oscillator signal; and
wherein transmitting the RF oscillator signal to the radar channel comprises:
transmitting the RF oscillator signal to the radar channel after amplifying the RF oscillator signal.

24. The radar transceiver according to claim 21, wherein the base band signal processing chain comprises an amplifier configured to amplify the output signal after being filtered by at least one of the high-pass filter or the low-pass filter.

\* \* \* \* \*